United States Patent
Skjelmose et al.

(10) Patent No.: US 12,272,948 B1
(45) Date of Patent: Apr. 8, 2025

(54) CONTROL OF A RENEWABLE ENERGY POWER PLANT TO DETECT A CONTROL FAULT

(71) Applicant: VESTAS WIND SYSTEMS A/S, Aarhus N (DK)

(72) Inventors: Mads Rajczyk Skjelmose, Risskov (DK); Ines Pereira Barreira, Aarhus C (DK); Kouroush Nayebi, Ikast (DK)

(73) Assignee: VESTAS WIND SYSTEMS A/S, Aarhus N (DK)

( * ) Notice: Subject to any disclaimer, the term of this patent is extended or adjusted under 35 U.S.C. 154(b) by 0 days.

(21) Appl. No.: 18/862,937

(22) PCT Filed: May 3, 2023

(86) PCT No.: PCT/DK2023/050108
§ 371 (c)(1),
(2) Date: Nov. 4, 2024

(87) PCT Pub. No.: WO2023/213368
PCT Pub. Date: Nov. 9, 2023

(30) Foreign Application Priority Data

May 3, 2022 (DK) .............................. PA202270234

(51) Int. Cl.
*H02J 3/00* (2006.01)
*F03D 17/00* (2016.01)
(Continued)

(52) U.S. Cl.
CPC ............ *H02J 3/001* (2020.01); *F03D 17/014* (2023.08); *G01R 21/00* (2013.01); *G08B 21/187* (2013.01);
(Continued)

(58) Field of Classification Search
CPC .... H02J 3/0011; H02J 3/24; H02J 3/38; H02J 2300/28; F03D 17/014; G01R 21/00; G08B 21/187; F05B 2260/80
(Continued)

(56) References Cited

U.S. PATENT DOCUMENTS

2017/0025855 A1   1/2017   Garcia
2019/0219033 A1*  7/2019   Caponetti ............. F03D 7/0204
(Continued)

FOREIGN PATENT DOCUMENTS

EP   3631930 A1   4/2020
EP   3669433 A1   6/2020
(Continued)

OTHER PUBLICATIONS

Danish Patent and Trademark Office, 1st Technical Examination including the Search Report and Search Opinion for Application PA 2022 70234 dated Nov. 2, 2022.
(Continued)

*Primary Examiner* — Michael R. Fin
(74) *Attorney, Agent, or Firm* — Patterson + Sheridan, LLP (57) ABSTRACT

Operating a renewable energy power includes receiving a measurement signal indicative of a measured power characteristic of the plant at a point of connection to a power network; controlling the plant 12) according to a normal mode of operation to provide power by determining and dispatching power set points, the power set points being determined by: acquiring samples of the measurement signal at a sample rate; and determining the power set points based on the sampled measurements and a target level for the measured power characteristic; and monitoring the measurement signal to detect an undersampled oscillation of the measured power characteristic in the sampled measurements, and thereby detecting a control fault; and then controlling the plant according to a fault mode of operation.

15 Claims, 8 Drawing Sheets

(51) Int. Cl.
  *G01R 21/00* (2006.01)
  *G08B 21/18* (2006.01)
  *H02J 3/24* (2006.01)
  *H02J 3/38* (2006.01)

(52) U.S. Cl.
  CPC .................. *H02J 3/24* (2013.01); *H02J 3/38* (2013.01); *F05B 2260/80* (2013.01); *H02J 2300/28* (2020.01)

(58) Field of Classification Search
  USPC .......................................................... 307/84
  See application file for complete search history.

(56) References Cited

U.S. PATENT DOCUMENTS

| | | | |
|---|---|---|---|
| 2020/0318614 A1* | 10/2020 | Hovgaard | ............. F03D 7/0224 |
| 2021/0167603 A1 | 6/2021 | Valcan et al. | |
| 2022/0060020 A1 | 2/2022 | Gupta et al. | |
| 2023/0122376 A1* | 4/2023 | Busker | .................... H02J 3/241 |
| | | | 307/102 |

FOREIGN PATENT DOCUMENTS

| | | |
|---|---|---|
| EP | 3767772 A1 | 1/2021 |
| WO | 2021223829 A1 | 11/2021 |

OTHER PUBLICATIONS

PCT International Search Report and Written Opinion of The International Searching Authority for Application PCT/DK2023/050108 dated Jul. 14, 2023 (Jul. 14, 2023).

Hanoch Lev-Ari, et al., "Application of Staggered Undersampling to Power Quality Monitoring", IEEE Transactions on Power Delivery, IEEE Service Center, New York, NY, US, vol. 15, No. 3, Jul. 1, 2000 (Jul. 1, 2000), 6 pages.

\* cited by examiner

CONTROL OF A RENEWABLE ENERGY POWER PLANT TO DETECT A CONTROL FAULT

TECHNICAL FIELD

The present invention relates to a method of controlling a renewable energy power plant, to a renewable energy power plant controller, and to a wind turbine power plant more generally.

BACKGROUND

A wind power plant (WPP) typically comprises a plurality of wind turbine generators (WTG)s and is also known as a wind park or a wind farm. The regulation and general operation of the power plant is controlled by a power plant control system or controller (PPC), which implements operational limits and requirements as set out by a Transmission System Operator (TSO) or in country-specific grid interconnection requirements or 'grid codes'. The TSO also communicates power delivery demands to the PPC.

During normal operation of the WPP, the role of the PPC is therefore to act as a command and control interface between the WPP and the grid operator or TSO, where the TSO is responsible for indicating the needs and requirements of the power network to the PPC. The PPC interprets the power delivery demands requested by the TSO and manages the WPP in order to satisfy those requirements.

For this purpose, the PPC may typically include one or more feedback control systems that control the WPP based on measurements of the power characteristics, such as the frequency, voltage level, active current or power level, and/or reactive current or power level, at the connection to the power network. However, feedback control systems are susceptible to instability when the measured power characteristics fluctuate at relatively high frequencies.

It is an aim of the present invention to improve upon conventional solutions.

SUMMARY OF THE INVENTION

According to an aspect of the present invention, there is provided a method of operating a renewable energy power plant comprising one or more renewable energy generators. The method comprises: receiving a measurement signal indicative of a measured power characteristic of the renewable energy power plant at a point of connection to a power network; controlling the renewable energy power plant according to a normal mode of operation to provide power by determining and dispatching power set points, the power set points being determined by: acquiring samples of the measurement signal at a sample rate; and determining the power set points based on the sampled measurements and a target level for the measured power characteristic; and monitoring the measurement signal to detect an undersampled oscillation of the measured power characteristic in the sampled measurements, and thereby detecting a control fault; and when the control fault is detected, controlling the renewable energy power plant according to a fault mode of operation.

In this context, the undersampled oscillation is an oscillation having greater than half the frequency of the sampling rate. In this manner, the invention monitors the measurement signal independently of the control of the plant according to the normal mode of operation such that undersampled oscillation(s) of the measured power characteristic in the sampled measurements can be detected to recognise a control fault. In this context, it shall be appreciated that the undersampled oscillations may be detected by performing a spectral analysis on the measurement signal, where such analysis is carried out independently of the program, algorithm, or "power controller" that determines the power set points. The power set points may be reactive set points and/or active set points.

In the normal mode of operation, the renewable energy power plant provides power to the power network in the form of active and/or reactive power by dispatching active and/or reactive power set points to the one or more renewable energy generators. The set points may in relation to active power set points define an amount of active power to be generate and in relation to the reactive power set points define an amount of reactive power to generate or consume.

The benefit of this is that control fault can be detected, and the fault mode of operation implemented to mitigate damage to the power plant and enabling a faster return to the normal operation of the power plant.

The target level may be received by or determined based on the demands of the grid operator, for example. Optionally, the fault mode of operation comprises generating an alert for notifying an operator of the control fault.

Optionally, the fault mode of operation comprises: controlling the renewable energy power plant to provide power by determining and dispatching power set points based on a reference reactive power level.

The fault mode of operation may comprise controlling the renewable energy power plant to generate an amount of active power and/or to generate or consume an amount of reactive power by dispatching active and/or reactive set points.

In an example, the fault mode of operation may further comprise: determining the reference power level based on one or more power set points determined prior to the fault.

The power level may be an active and/or a reactive power level based on one or more active and/or reactive power set points, respectively.

In an example, determining and dispatching power set points during the fault mode may comprise: calculating a rate of change for transitioning between a current power set point and the reference power level; and determining and dispatching the power set points based on the calculated rate of change.

Optionally, determining and dispatching power set points during the fault mode further comprises: determining and dispatching the power set points at the reference power level, once reached, for the remainder of the fault mode of operation.

In an example, the fault mode may be applied until one or more end conditions are satisfied. For example, the one or more end conditions may include one or more selected from: a threshold period of time having elapsed since applying the fault mode; an override signal being received from an operator; and/or detecting a non-oscillatory period of the measured power characteristic.

In an example, following the fault mode of operation, the method further comprises: implementing a bumpless transfer operation; and controlling the renewable energy power plant according to the normal mode of operation; wherein the bumpless transfer operation comprises determining the target level for the power characteristic following the fault mode by: setting the target level for the power characteristic to a present sample measurement level; and calculating a rate of change to transition between the present target level and a post-fault target level suitable for normal operation of the renewable energy power plant.

Optionally, the step of monitoring the measurement signal to detect an undersampled oscillation in the sampled measurements comprises: performing spectral analysis on successive periods of the measurement signal to detect an oscillatory period of the measured power characteristic having one or more undersampled oscillations.

One or more power set points determined during a non-oscillatory period may, for example, be stored in a memory. The reference power level may, for example, be determined based on the one or more set points stored in the memory.

Optionally, the memory stores one or more power set points determined during the most recent two non-oscillatory periods.

Optionally, detecting the control fault comprises: detecting at least two successive oscillatory periods having undersampled oscillations, each oscillation having a greater frequency than half the sampling rate, using the spectral analysis. The spectral analysis may be performed using a Fast Fourier Transform, for example.

According to another aspect of the invention there is provided a power plant controller for controlling operation of a renewable energy power plant comprising one or more renewable energy generators and connected to a power network. The power plant controller is configured to execute machine readable instructions to: receive a measurement signal indicative of a measured power characteristic of the renewable energy power plant at a point of connection to a power network; control the renewable energy power plant according to a normal mode of operation to provide power by determining and dispatching power set points, the power set points being determined by: acquiring samples of the measurement level at a sample rate; and determining the power set points based on the sampled measurements and a target level for the measured power characteristic; and monitor the measurement signal to detect an undersampled oscillation of the measured power characteristic in the sampled measurements, and thereby detect a control fault; and when the control fault is detected, control the renewable energy power plant according to a fault mode of operation.

According to an aspect of the invention, there is provided a computer-readable storage medium comprising instructions that, when executed by a computer, cause the computer to perform the method described above.

Within the scope of this invention it is expressly intended that the various aspects, embodiments, examples and alternatives set out in the preceding paragraphs, in the claims and/or in the following description and drawings, and in particular the individual features thereof, may be taken independently or in any combination. That is, all embodiments and/or features of any embodiment can be combined in any way and/or combination, unless such features are incompatible. The applicant reserves the right to change any originally filed claim or file any new claim accordingly, including the right to amend any originally filed claim to depend from and/or incorporate any feature of any other claim although not originally claimed in that manner.

BRIEF DESCRIPTION OF THE DRAWINGS

One or more embodiments of the invention will now be described, by way of example only, with reference to the accompanying drawings, in which.

DETAILED DESCRIPTION

Generally, the present invention relates to methods and systems for operating a renewable energy power plant, such as a wind power plant, comprising one or more renewable energy generators.

The methods and systems of the present invention are configured to receive a measurement signal indicative of a power characteristic of the power plant and to control the power plant according to a normal mode of operation. In this context, the term 'power characteristic' encompasses characteristics including a frequency, an active power level, an active current level, a reactive power level, a reactive current level, a power factor level and/or a voltage level at a point of connection of the power plant to a power network.

When controlling the power plant according to the normal mode of operation, the amount of power provided by the power plant is controlled by determining and dispatching power set points based on a target level for the power characteristic and samples of the measurement signal acquired at a sample rate.

The sample rate is typically optimised for a program, algorithm, or "power controller" of the control system that determines the power set points. However, when controlling the renewable energy power plant according to the normal mode of operation, relatively high frequency oscillations of the measured power characteristic can occur, such that the power controller is prone to undersampling the measurement signal. Consequently, the sampled measurements acquired by the power controller distort the measurement signal, leading to erroneous operation of the renewable energy power plant. For example, when the measured power characteristic fluctuates at a greater frequency than the sampling rate, and particularly when the measured power characteristic fluctuates at a greater frequency than the Nyquist frequency of the power controller, i.e. greater than half the sampling rate, the sampled measurements are undersampled for the measurement signal. Consequently, the sampled measurements may falsely indicate that the measured power characteristic, remains above/below a threshold, in spite of corrective control actions by the control system, when the measured power characteristic is actually in an oscillatory state during that period. As a result, the normal mode of operation would typically control the power plant in a manner that amplifies and/or exacerbates the fluctuations in the measured power characteristic. The active and reactive power controller may comprise two separate controllers one for reactive power control and one for active power control.

Advantageously, to counteract these issues, the methods and systems of the present invention are further configured to independently monitor the measurement signal to detect an undersampled oscillation of the measured power characteristic in the sampled measurements, and thereby to detect a control fault. In this context, it shall be appreciated that the undersampled oscillations may be determined by performing a spectral analysis on successive periods, or fixed-time windows, of the measurement signal, where such analysis is carried out independently of the program, algorithm, or "power controller" of the control system that determines the power set points.

Upon detecting the control fault, the renewable energy power plant can be controlled according to a fault mode of operation, during which the renewable energy power plant may be controlled to generate an alert for notifying an operator of the control fault and/or to determine and dispatch active and/or reactive power set points that may be prescribed for the fault mode or otherwise determined based on one or more of the active and/or reactive power set points determined prior to the fault.

The benefit of this is that oscillations of the measured power characteristic can be reduced, mitigating damage to the power plant and enabling a faster return to the normal operation of the power plant.

Figure 1:
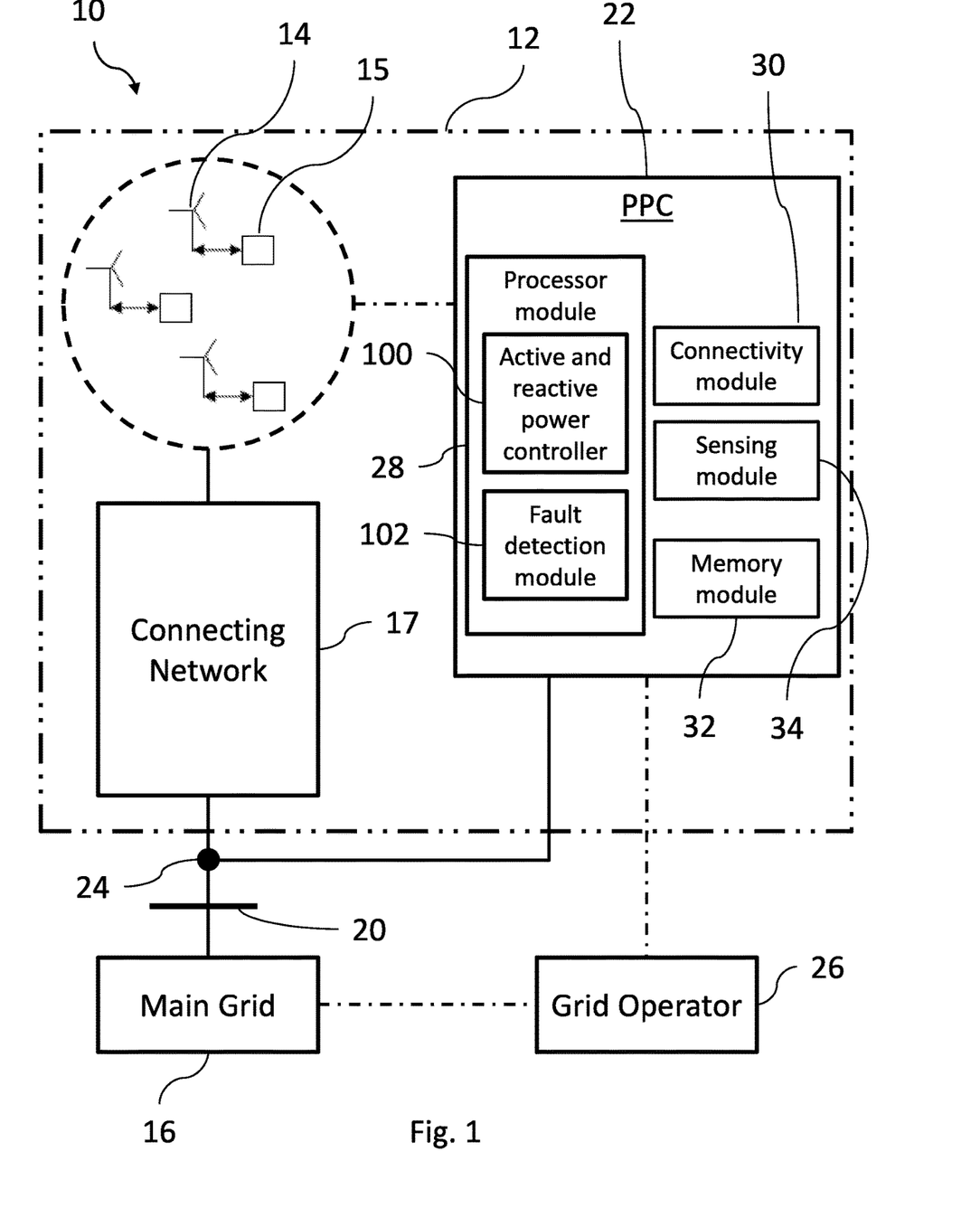
FIG. 1 is a schematic architecture of a power network including a wind power plant and a main grid.

FIG. 1 illustrates a typical architecture in which a wind power plant (WPP) is connected to a main transmission grid as part of a wider power network. The diagram of FIG. 1 should only be taken as a representation of a power network. Alternative configurations of power network and power plants are known and it is expected that other known components may be incorporated in addition to or as alternatives to the components shown and described in FIG. 1. Such changes would be within the capabilities of the skilled person. For example, substations or extra transformers would be expected to be incorporated in the WPP depending upon the number of WTGs included in the plurality of WTGs.

As will be understood by the skilled reader, a WPP comprises at least one wind turbine generator (WTG), more typically referred to as a 'wind turbine'. WPPs are also known as wind parks or wind farms. The examples shown are representative only and the skilled reader will appreciate that other specific architectures are possible, in relation to both wind power plants, power plants for other renewable energy sources, wind turbine generators and other renewable energy generating sources. Thus, this disclosure relates to renewable energy power plants and renewable energy generators in general, rather than being specific to wind power plants and generators as in the Figures. In addition, the skilled reader will appreciate that methods, systems and techniques also described below may be applicable to many different configurations of power network.

Moreover, the components of the wind power plant and power network are conventional and as such would be familiar to the skilled reader. It is expected that other known components may be incorporated in addition to or as alternatives to the components shown and described in the Figures. Such changes would be within the capabilities of the skilled person. In particular, it will be appreciated that the WPP may also be considered to comprise STATCOM equipment, substation equipment, cables, plant controllers, and other componentry required to connect the WPP to a main grid.

Furthermore, the skilled reader will understand that FIG. 1 is a schematic view, so the way in which the control commands are transferred is not depicted explicitly. The interconnections may be direct or 'point to point' connections, or may be part of a local area network (LAN) operated under a suitable protocol (CAN-bus or Ethernet for example). Also, it should be appreciated that rather than using cabling, the control commands may be transmitted wirelessly over a suitable wireless network, for example operating under WiFi™ or ZigBee™ standards (IEEE802.11 and 802.15.4 respectively).

FIG. 1 shows a power network 10 incorporating a WPP 12. The WPP 12 includes a plurality of WTGs 14. Each of the plurality of WTGs 14 converts wind energy into electrical energy, which is transferred from the WTGs 14 to a main power network or main grid 16, as active current, for distribution.

WTGs 14 generate both active power and reactive power. The main grid 16 often has specific active and reactive power level requirements with which the WPP 12 is required to comply, and the output of the WTGs 14 can be changed to match these requirements in real time. Other grid requirements may be specified for reactive and active current levels and for voltage levels at specific points within the power network.

Each of the WTGs 14 is associated with a respective WTG controller 15. In some examples, a set of WTGs may share a single, semi-centralised WTG controller, such that there are fewer WTG controllers than WTGs. As would be understood by the skilled person, WTG controllers 15 can be considered to be computer systems capable of operating a WTG 14 in the manner prescribed herein, and may comprise multiple modules that control individual components of the WTG or just a single controller. The computer system of the WTG controller 15 may operate according to software downloaded via a communications network or programmed onto it from a computer-readable storage medium.

During normal operation of the WPP 12, the WTG controllers 15 operate to implement active and reactive current, and/or power, requests received from the PPC 22 to provide frequency and voltage support to the main grid 16. During extraordinary conditions, the WTG controllers 15 operate to fulfil predetermined network requirements, and also act to protect the WTGs 14 from any potentially harmful conditions.

In FIG. 1, the WPP 12 is shown to include a connecting network 17 for connecting the WPP 12 to the main grid 16. Connecting networks are known in the art and comprise a combination of transmission lines, buses and/or transformers to couple the WPP 12 to the main grid 16. Other components such as circuit breakers, reclosers, and other systems known in the art may also be incorporated into the connecting network. In this example, the WPP 12 and the main grid 16 are connected at a Point of Interconnection (PoI) 20, which is an interface between the WPP 12 and the main grid 16. The PoI 20 may also be referred to as the Point of Common Coupling, which may be abbreviated to 'PCC' or 'PoCC'.

The Power Plant Controller (PPC) 22 is connected to the main grid 16 at a Point of Measurement (PoM) 24 and is connected to the WTG controllers 15. For example, the PPC 22 may be configured to receive one or more measurement signals from the PoM 24 comprising measurements of the characteristics of the power supply from the WPP 12 to the main grid 16. Such power characteristics may include a frequency level, a power factor, a voltage level, an active current level, an active power level, a reactive current level and/or a reactive power level exchanged between the WPP 12 and the main grid 16. As the PoM 24 is not at the PoI 20 in this example, parameters measured at the PoM 24 are only considered to be representative values as losses in the lines between the PoM 24 and PoI 20, and between the PoM 24 and the PPC 22, may have an effect on the measurements. Accordingly, the measurements may be suitably compensated to account for the losses and ensure that the measurements used by the PPC 22 are accurate.

The role of the PPC 22 is to act as a command and control interface between the WPP 12 and the grid 16, and more specifically, between the WPP 12 and a grid operator 26, such as a transmission system operator (TSO) or a distribution system operator (DSO).

In its role as command and control interface, the PPC 22 interprets the power delivery demands requested of it by the grid operator 26 and monitors the measured power characteristics to manage the WTGs 14 of the WPP 12 in order to satisfy the power demands, as will be elaborated on in the following description. The PPC 22 is therefore a suitable computer system for carrying out the controls and commands as described herein and so may incorporate a processing module 28, a connectivity module 30, a memory module 32 and a sensing module 34, as shown in FIG. 1.

The WTGs 14 are capable of altering their current or power output in reaction to commands received from the PPC 22. In particular, as part of its operation, the PPC 22 generates and sends dispatch signals to the WTG controllers 15 and the WTG controllers 15 control the WTGs 14 according to set points contained within the dispatch signals.

During a normal mode of operation, the WTGs 14 are substantially continuously controlled according to the control signals dispatched by the PPC 22. When controlling the power plant according to the normal mode of operation, the PPC 22 is configured to receive a measurement signal, for example from the PoM 24, that is indicative of a power characteristic of the WPP 12 and to control the amount of power provided by the WPP 12 in order to meet a target level for the power characteristic. IN this context, the target level may correspond to the demands requested of the WPP 12 by the grid operator 26, for example.

The PPC 22 controls the WPP 12 in this manner by determining and dispatching active and/or reactive power set points based on the measured power characteristic and the target level for that power characteristic. For example, the measured power characteristic may be indicative of, or correspond to, a power factor, an active power level, an active current level, a reactive power level, a reactive current level and/or a voltage level at the PoI 20 between the WPP 12 and the main grid 16. The target level for that power characteristic may be received at, or otherwise determined by the PPC 22, based on the demands of the grid operator 26.

In order to determine the power set points, the PPC 22 may include a program, algorithm, or "active and reactive power controller" 100, in accordance with an embodiment of the invention, which forms part of the processing module 28 of the PPC 22. The active and reactive power controller 100 may include one or more feedback loops, for example, and acquires samples of the measurement signal at a sample rate to determine successive active and/or reactive power set points. The sample rate is typically optimised for the program, algorithm, or "active and reactive power controller" 100 and may typically be in the region of 10 to 20 samples per second, for example.

Various methods and control system architectures are known in the art for determining power set points based on a comparison between sampled measurements of a power characteristic and a target level for the power characteristic, which are not described in detail here to avoid obscuring the invention. Nonetheless, it shall be appreciated that the active and reactive power controller 100 may include one or more feedback loops, schemes, rules, algorithms, and/or look-up tables for this purpose.

As will be further understood by the skilled person, during a normal mode of operation, the WPP 12 may be operated according to one of a voltage control mode, a power factor control mode, a frequency control mode, an active power control mode, and/or a reactive power control mode, and the PPC 22 will determine active and/or reactive power set points according to the respective mode. For example, a WPP operated in voltage control mode is controlled to maintain a voltage level and the active and reactive power controller 100 will therefore determine reactive power set points by comparing sampled measurements of the voltage at the PoI 20 to a target voltage. A WPP operated in power factor control mode is controlled to maintain a power factor and the active and reactive power controller 100 will therefore determine reactive power set points by comparing sampled measurements of the power factor to a target power factor. A WPP operated in a frequency control mode is controlled to maintain a frequency level and the active and reactive power controller 100 will therefore determine active power set points by comparing sampled measurements of the frequency at the PoI 20 to a target frequency. A WPP operated in an active power control mode is controlled to provide an active power level and the active and reactive power controller 100 will therefore determine active power set points by comparing sampled measurements of the active power at the PoI 20 to a target active power level. Finally, a WPP operated in a reactive power control mode is controlled to consume or supply a reactive power level and the active and reactive power controller 100 will therefore determine the reactive power set points by comparing sampled measurements of the reactive power at the PoI 20 to a target reactive power level. Hence, the PPC 22 may receive one or more measurements signals, and one or more indications of a mode of operation, and determine reactive power set points to be dispatched to the WPP 12 based on these inputs. Signal conditioning may be performed on the reactive power set points before dispatch to the WPP 12, where WTGs 14 are controlled so that the reactive power set points are met.

Hence, during the normal mode of operation, the PPC 22 is able to operate the WPP 12 to satisfy the requirements of the grid operator 26.

However, when controlling the renewable energy power plant according to the normal mode of operation, relatively high frequency oscillations of the measured power characteristics can occur, for example due to grid faults. During such conditions, the active and reactive power controller 100 is prone to undersampling the measurement signal such that the sampled measurements acquired by the active and reactive power controller 100 distort the measurement signal in a manner known as aliasing, leading to erroneous operation of the WPP 12.

Figure 2:
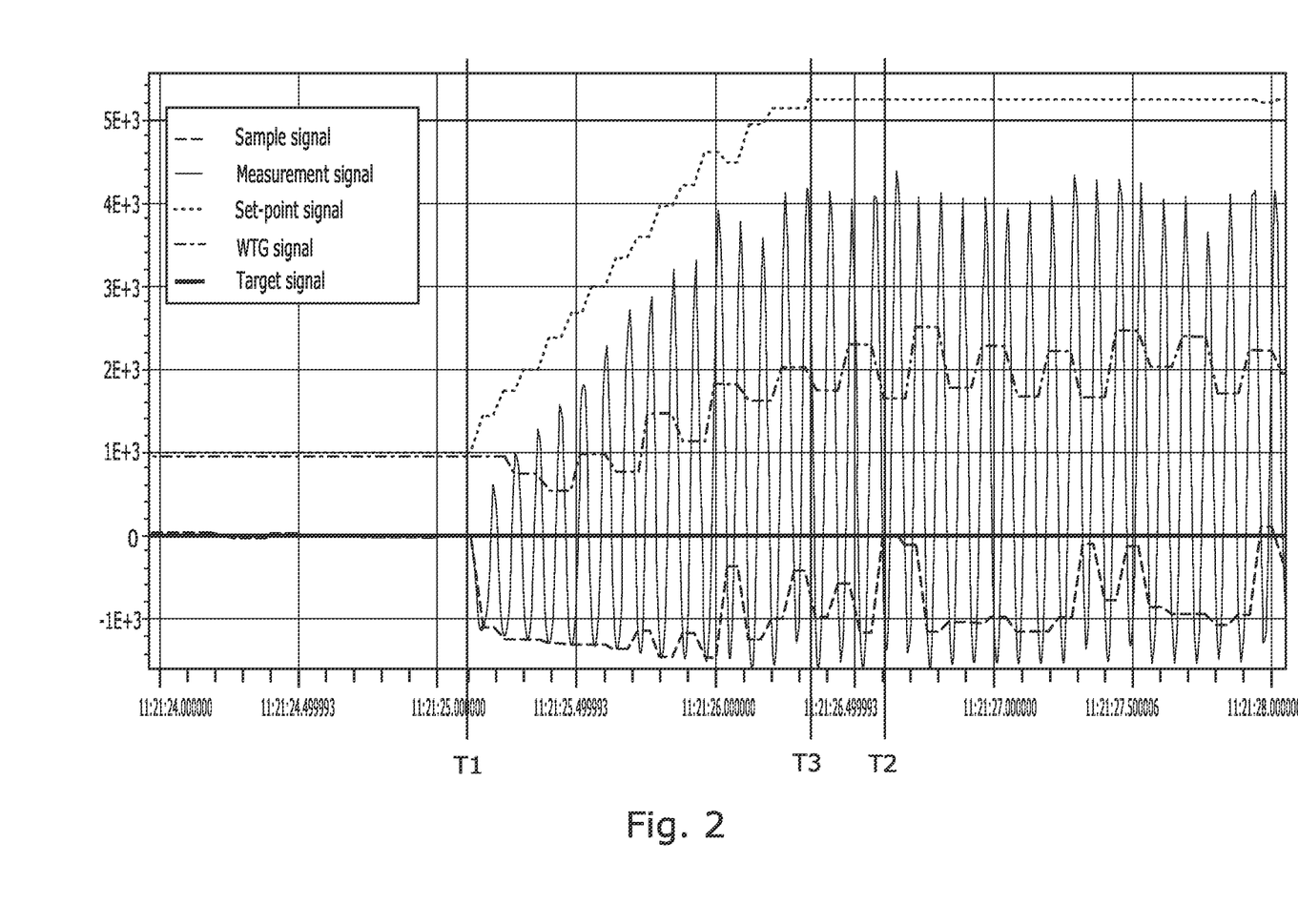
FIG. 2 is a representation demonstrating an example fault scenario due to aliasing of a sampled measurement signal used in the control of the wind power plant of FIG. 1.

By way of example, FIG. 2 is provided to illustrate the control faults that may arise due to aliasing of the measurement signal in the active and reactive power controller 100.

For the purposes of this example, the measured power characteristic is the reactive power level at the PoI 20. Accordingly, the graph depicts a measurement signal representing the measured level of the reactive power, as well as a target signal representing the target level for the active and reactive power, a sample signal depicting the sampled measurements acquired by the active and reactive power controller 100 at the sample rate, a set-point signal depicting the reactive power set points determined by the reactive power controller 100, and a WTG signal depicting the reactive power level of the WTGs 14.

As shown in FIG. 2, initially, the measurement signal is substantially equal to the target signal and the set-point signal is held substantially constant until a time, T1. After the time, T1, the measurement signal starts to oscillate, for example due to a fault or disturbance of the main grid 16. The oscillations of the measurement signal are too high for the sample rate of the active and reactive power controller 100 and so the sampled measurements distort the measurement signal. In particular, aliasing occurs and the sample signal indicates that the measured reactive power level remains below the target signal, for example up to the time, T2. As a result, the active and reactive power controller 100 determines and dispatches reactive power set points that increase the reactive power demand to an upper reactive power limit at time, T3, as illustrated by the set-point signal. Consequently, the measured reactive power remains oscillatory and the fault persists with the average reactive power increasing above the target signal. This leads to a control fault, in which the PPC 22 controls the WTGs 14 to exacerbate or amplify the oscillations and the active and reactive power controller 100 is unable to correct the fault. Consequently, after the time, T2, the sampled measurement signal largely remains below the target signal but fluctuates significantly due to the distorted oscillations and the set-point signal remains substantially at the upper reactive power limit, unable to rectify the fault. This condition leads to unsafe operation and/or damage of the WPP 12.

To address this problem, the PPC 22 of the present invention is further configured to independently monitor the measurement signal to detect an undersampled oscillation of the power characteristic, and thereby to detect a control fault. That is, the PPC 22 monitors the measurement signal, independently of the program, algorithm, or active and reactive power controller 100 that acquires samples of the measurement signal at the sample rate and thereby determines the power set points, in order to detect undersampled oscillations of the measured power characteristic. In this context it shall be appreciated that an undersampled oscillation is any oscillation having a frequency that is greater than the Nyquist frequency of the active and reactive power controller 100 (i.e. a frequency that is greater than half the sample rate).

It shall be appreciated that the PPC 22 may detect the undersampled oscillations according to one or more mathematical and/or graphical methods that are known in the art for detecting oscillations of a signal, which are not described in detail here to avoid obscuring the invention.

For this purpose, the PPC 22 may further include an algorithm, process or "fault detection module" 102, which forms part of the processing module 28 of the PPC 22, for monitoring the measurement signal. To give an example, the fault detection module 102 may be configured to monitor the measurement signal by performing a spectral analysis on successive periods of the measurement signal to detect a so-called oscillatory period having one or more, or a threshold amount, of undersampled oscillations. For example, the fault detection module 102 may be configured to perform the spectral analysis using a Fast Fourier Transform to determine the frequency characteristics of the measurement signal.

Upon detecting the control fault, the PPC 22 of the present invention is further configured to control the WPP 12 according to a fault mode of operation instead of the normal mode of operation. During the fault mode of operation, the PPC 22 may take active or passive measures to resolve the control fault.

For example, according to the fault mode of operation, the PPC 22 may generate an alert for notifying an operator of the control fault, such that the operator can control or instruct corrective action. In the meantime, the PPC 22 may continue to determine and dispatch power set points as described in the normal mode of operation until an operator controls or triggers corrective action.

In another example, the PPC 22 may additionally or alternatively be configured to take proactive control and to determine and dispatch active and/or reactive power set points based on a reference active and/or reactive power level for the fault mode of operation, respectively. The reference active and reactive power levels may be preprogramed for the fault mode of operation or otherwise determined based on one or more of the active and reactive power set points determined prior to the fault, for example.

However, there may be a significant difference between the power levels of the set points determined during the control fault and the reference power level and a sudden change in the power level is inadvisable because it may lead to instability of the grid.

Hence, during the fault mode of operation, the PPC 22 may determine power set points that ramp from the level upon detecting the control fault to the reference power level. Thereafter, as the fault mode of operation continues, the power set points may be frozen at the reference power level until one or more end conditions are satisfied for returning to the normal mode of operation. In this manner, the PPC 22 may counteract the control fault and stabilise the control of the WPP 12, dampening any oscillatory behaviour in the measured power characteristic.

The operation of the PPC 22 shall now be described with additional reference to FIGS. 3 to 7.

Figure 3:
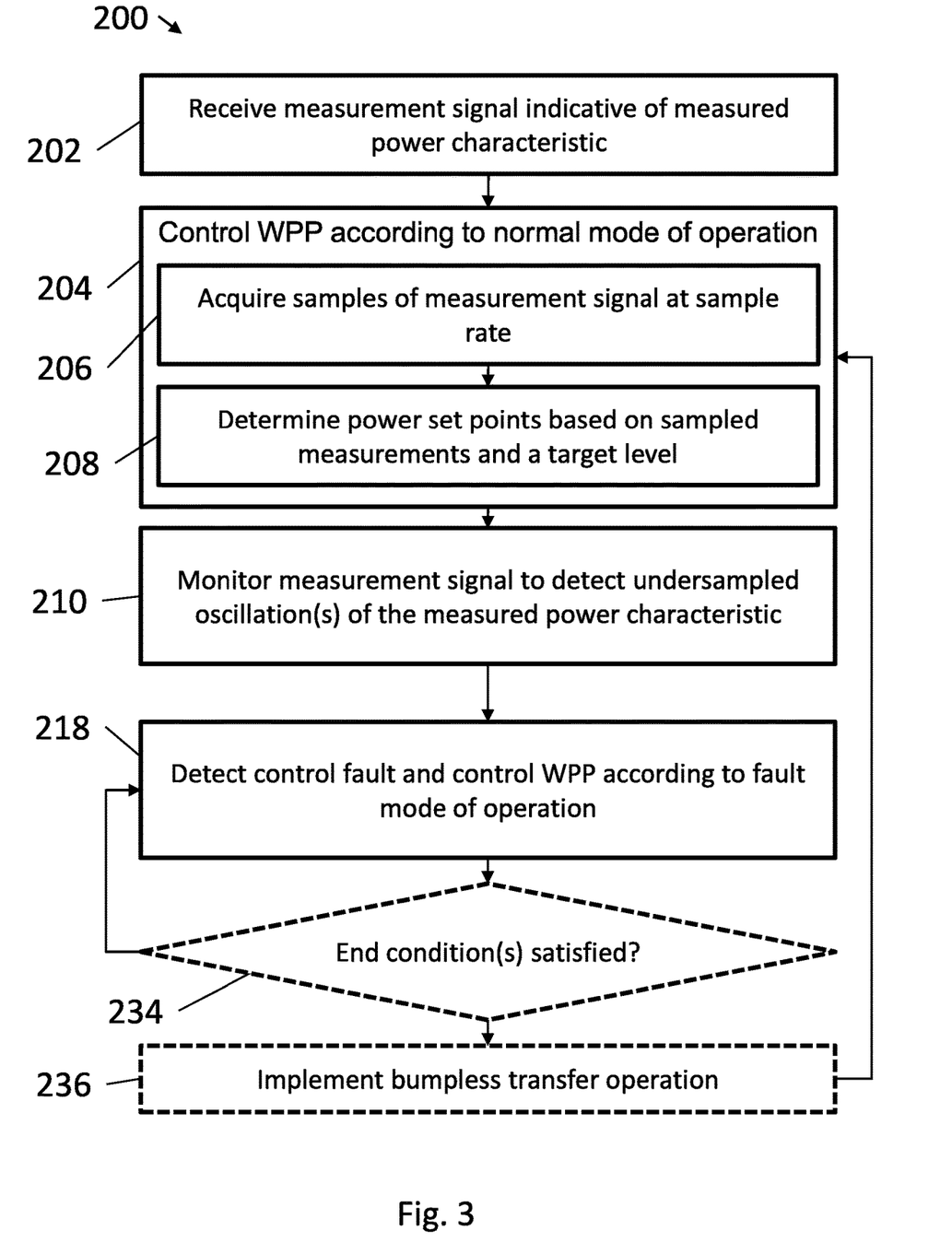
FIG. 3 is a flow chart illustrating a method of operating the wind power plant of FIG. 1, in accordance with an embodiment of the present invention.

FIG. 3 shows an example method 200 of controlling the WPP 12 to generate or consume power in accordance with an embodiment of the invention.

In step 202, the PPC 22 receives the measurement signal indicative of at least one of the power characteristics of the WPP 12 at the PoI 20 between the WPP 12 and the main grid 16.

For example, the PPC 22 may receive a measurement signal determined at the PoM 24, which is indicative of a voltage level, a power factor level, an active current level, an active power level, a reactive current level and/or a reactive power level at the PoI 20.

In step 204, the PPC 22 is configured to control the WPP 12, according to a normal mode of operation, to provide power by determining and dispatching power set points to satisfy the requirements of the grid operator 26.

For this purpose, the active and reactive power controller 100 is configured to acquire samples of the measurement signal at a sample rate, in sub-step 206, and to determine successive power set points, in sub-step 208, based on the sampled measurements and a target level for the power characteristic. In this respect, the target level may correspond to the demands of the power supply requested by the grid operator 26, as may be received, or otherwise determined, at the active and reactive power controller 100, for example.

As noted previously, various methods are known in the art for determining power set points based on the sampled measurements and the target level for the power characteristic, which may involve the use of one or more control loops, scheme, rules, algorithms, or look-up tables for determining the power set points. However, such methods are not described in any detail here to avoid obscuring the invention.

The determined power set points are dispatched to the WPP 12 and the WTG controllers 15 operate the WTGs 14 to generate or consume corresponding amounts of reactive power. The power set points may be active and/or reactive power setpoints.

In parallel with the normal mode of operation, the PPC 22 independently monitors the received measurement signal to detect undersampled oscillation(s) of the measured power characteristic, in step 210.

In particular, the fault detection module 102 of the PPC 22 monitors the measurement signal, independently of the active and reactive power controller 100, to detect any undersampled oscillation(s) of the measured power characteristic in the sampled measurements. For this purpose, it shall be appreciated that the algorithm, process, or fault detection module 102 of the PPC 22 may process the measurement signal without sampling, or otherwise at a significantly higher sampling rate, than the active and reactive power controller 100 in order to detect such undersampled oscillations.

As noted above, various mathematical and graphical methods are known in the art for detecting oscillations of a signal and identifying the undersampled oscillations, which are not described in detail here to avoid obscuring the invention.

Figure 4:
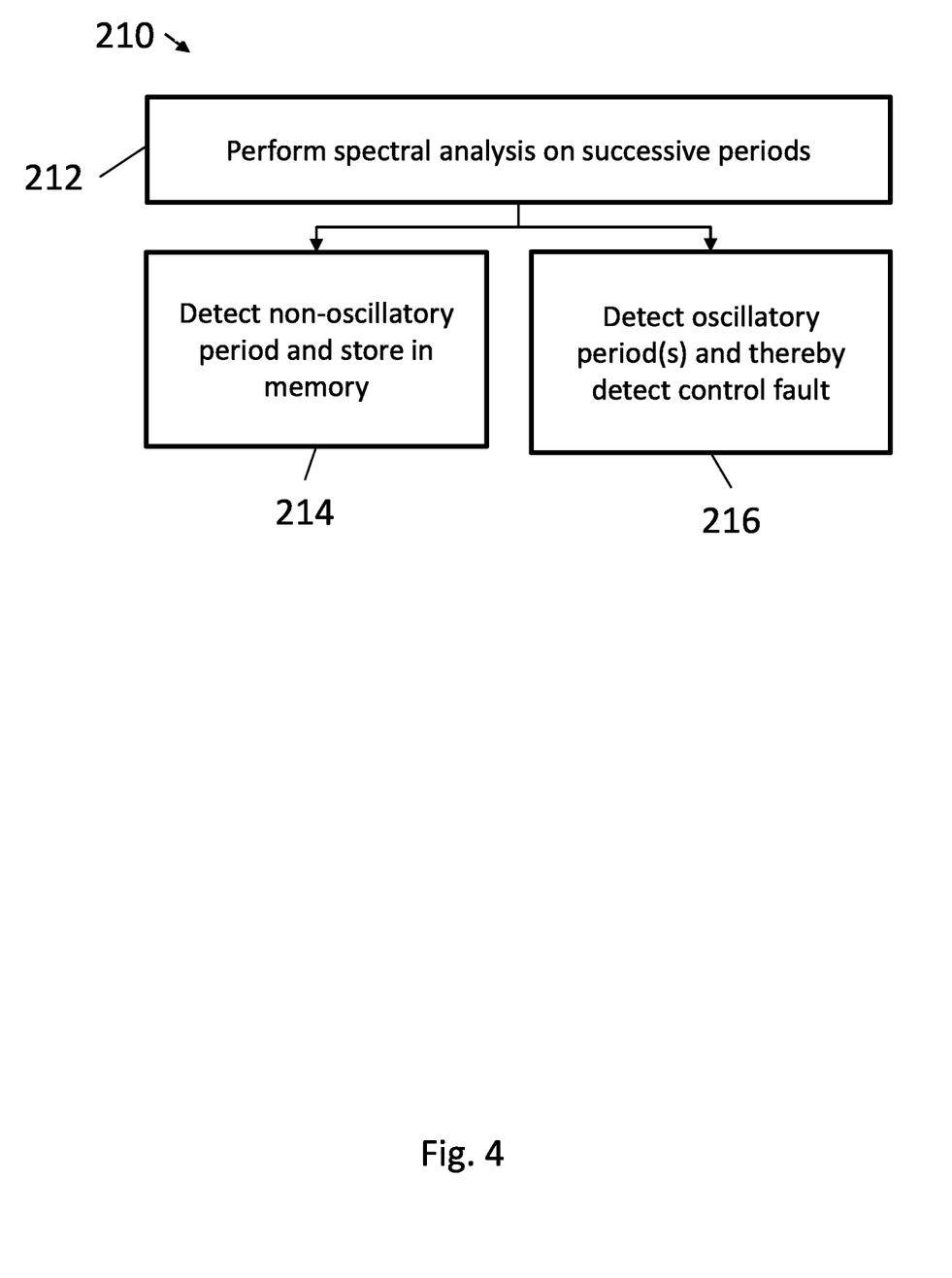
FIG. 4 is a flow chart illustrating example sub-steps, in accordance with an embodiment of the invention, of the method of FIG. 3.

However, to give an example, FIG. 4 shows example sub-steps 212 to 216 for monitoring the measurement signal to detect the undersampled oscillation(s) by performing spectral analysis on successive periods of the measurement signal, in accordance with an embodiment of the invention.

In sub-step 212, the PPC 22 performs a spectral analysis on successive periods of the measurement signal. For example, the fault detection module 102 may segment the measurement signals into successive fixed-time windows and perform a spectral analysis on each period, for example using a FFT, to determine the frequency components of the measurement signal, and thereby detect any undersampled oscillations of the measured power characteristic during that period.

If the analysed period is non-oscillatory, i.e. it does not contain any undersampled oscillations or it contains less than a threshold amount of undersampled oscillations (i.e. oscillations having a greater frequency than half the sampling rate of the active and reactive power controller 100), the fault detection module 102 may store information concerning that non-oscillatory period in the memory module 32 of the PPC 22, in sub-step 214.

For example, the fault control module 102 may store one or more of the active and reactive power set points determined during that non-oscillatory period in the memory, which may be used as a reference level for determining active and/or reactive power set points in the event of a subsequent control fault. In examples, the memory module 32 of the PPC 22 may be configured to store the information concerning a prescribed number, e.g. two, of the most recent non-oscillatory periods. Hence, upon determining a third successive non-oscillatory period, the information stored in the memory module 32 may be updated accordingly to retain information concerning the two most recent non-oscillatory periods.

If the fault detection module 102 determines one or more successive oscillatory periods containing one or more, or a threshold amount, of undersampled oscillations, the fault detect module 102 may detect a control fault, in sub-step 216, and control the PPC 22 to enter a fault mode of operation.

For example, the fault detection module 102 may be configured to detect a control fault if the spectral analysis, performed in sub-step 212, indicates that two successive periods are oscillatory (having one or more undersampled oscillations). In this respect, the threshold of two successive periods may be applied to confirm that the oscillations are not transient or have not been otherwise resolved by the operation of the WPP 12.

Returning to FIG. 3, upon detecting the control fault, the PPC 22 proceeds to control the WPP to provide power according to the fault mode of operation in step 218.

During the fault mode of operation, the PPC 22 may take active or passive measures to resolve the control fault, where passive measures may involve alerting a plant or grid operator and waiting for the operator to instruct or control corrective action, while active measures may involve one or more rules, algorithms, or processes for adjusting the reactive power set points.

Figure 5:
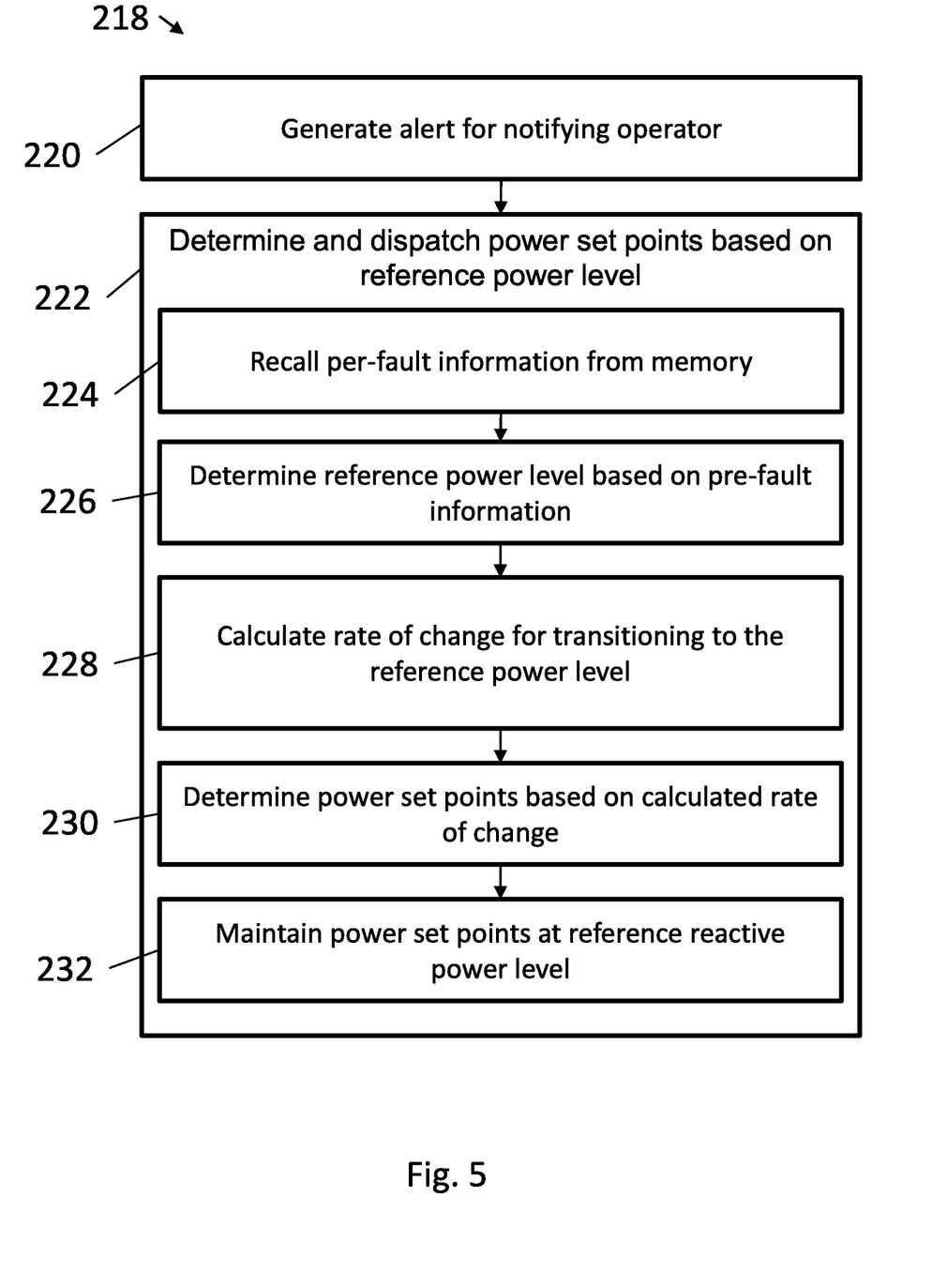
FIG. 5 is another flow chart illustrating example sub-steps, in accordance with an embodiment of the invention, of the method of FIG. 3.

To give an example, FIG. 5 shows example sub-steps 220 to 226 for controlling the WPP 12 according to the fault mode of operation, in accordance with an embodiment of the invention.

In sub-step 220, the PPC 22 generates an alert for notifying an operator of the WPP 12 of the control fault. For example, the PPC 22 may generate an alert to notify the plant or grid operator via the connectivity module 30.

In sub-step 222, the PPC 22 controls the WPP 12 to provide power by determining and dispatching power set points based on a reference power level.

The reference power level may be a prescribed or pre-programed level of active and/or reactive power suitable for the fault mode of operation or the reference power level may be determined based on one or more active and/or reactive power set points determined prior to the control fault.

In an example, sub-step 222 may further comprise sub-steps 224 and 226, as shown in FIG. 5, for determining the reference power level based on one or more power set points determined prior to the control fault.

Accordingly, in an example, in sub-step 224, the PPC 22 may recall the information stored in the memory module 32 and, in particular, the information relating to the two most recent non-oscillatory periods of the measurement signal.

In sub-step 226, the PPC 22 may determine the reference power level based on the active and/or reactive power set points determined during those pre-fault periods, for example as an average of those power set points determined prior to the control fault or as an average of the power set points determined during the earliest period stored in the memory module 32.

Once the PPC 22 has determined the reference power level, the PPC 22 may proceed to determine the active and/or reactive power set points for the fault mode of operation accordingly.

However, to mitigate against any sudden changes in the power level, the PPC 22 may be configured to determine power set points that ramp or otherwise transition to the reference power level.

In an example, sub-step 222 may therefore further comprise sub-steps 228 and 232 for determining the power set points during the fault mode of operation, as shown in FIG. 5.

In sub-step 228, the PPC 22 may calculate a rate of change for transitioning between a current power set point and the reference power level. In particular, the PPC 22 may determine a ramp up, or a ramp down, rate for adjusting the power based on a comparison between the current power set point and the reference power level. In this context, the ramp rate may be determined according to one or more rules, algorithms, or look-up tables that into account respective ramp rate limits, which may be prescribed by grid requirements, to maintain a stable frequency level and/or to maintain a stable voltage level at the grid 16, for example. For example, the grid code may specify a particular time period within which the transition must be completed, thereby providing a minimum ramp rate for the transition period.

In sub-step 230, the PPC 22 may determine the power set points based on the calculated rate of change and thereby transition to the reference power level.

Once the current power set point has reached the reference power level, the PPC 22 may continue to determine power set points corresponding to the reference power level, in sub-step 232, for the remainder of the fault mode of operation. In this manner, the PPC 22 may effectively freeze the power of the WPP 22 at the reference level.

Returning to FIG. 3, in step 234 of the method 200, the PPC 22 may check whether one or more ends conditions have been satisfied for terminating the fault mode of operation and returning to the normal mode of operation.

For example, the one or more end conditions may include one or more selected from: a threshold period of time having elapsed since applying the fault mode; an override signal being received from an operator; and/or detecting a stable condition of the measured power characteristic, i.e. a return to normal levels.

If the one or more fault conditions are not satisfied, the PPC 22 may continue to control the WPP 12 according to the fault mode of operation, as described in step 218.

However, if the fault conditions(s) are satisfied, the PPC 22 may return to the normal mode of operation in step 204.

First though, in some embodiments, as depicted in FIG. 3, the PPC 22 may be configured to implement a bumpless transfer operation, in step 236, upon detecting that the end condition(s) are satisfied.

In particular, upon returning to the normal mode of operation, the PPC 22 determines and dispatches active and/or reactive power set points based on the sampled measurements and the target level for the measured power characteristic. However, the change in operation can lead to a sudden change in the power level upon returning to the normal mode of operation.

To mitigate this, the PPC 22 may implement the bumpless transfer operation in step 236. Bumpless transfer operations are known in the art and are not described in detail here to avoid obscuring the invention.

Briefly though, in step 236, the PPC 22 may determine the target level for the power characteristic according to the bumpless transfer operation by: (i) setting the target level for the power characteristic to the current sample measurement; and (ii) calculating a rate of change to transition between that target level and a post-fault target level that is suitable for normal operation of the renewable energy power plant. The post-fault target level may be received at, or otherwise determined by, the PPC 22, for example based on the power delivery demands of the grid operator before or after the control fault.

Using this approach, the target level received or otherwise determined by the PPC 22 is altered according to a pre-determined rate of change or 'ramp rate'. The pre-determined ramp rate is designed to conform with the grid code requirements of the main grid. For example, the grid code may specify a particular time period within which the transition must be completed, thereby providing a minimum ramp rate for the transition period. The PPC 22 implements the ramp rate using a series of step changes to the reactive power reference levels it provides to the WTGs 14. Using a pre-determined ramp rate advantageously permits the controlled transition between the fault mode of operation and the normal mode of operation, and reduces the likelihood of instability in the grid. The ramp rate for the active power may be different from the ramp rate for the reactive power. The skilled person will appreciate that the ramp rate may be implemented in any conventional way.

Once the target level for the power characteristic has reached the post-fault target, the bumpless transfer operation is complete and normal operation of the WPP 12 is resumed.

It is expected that the present invention will therefore indicate and counteract oscillations of the measured power characteristic, mitigating damage to the power plant and enabling a faster return to the normal operation of the power plant.

Figure 6:
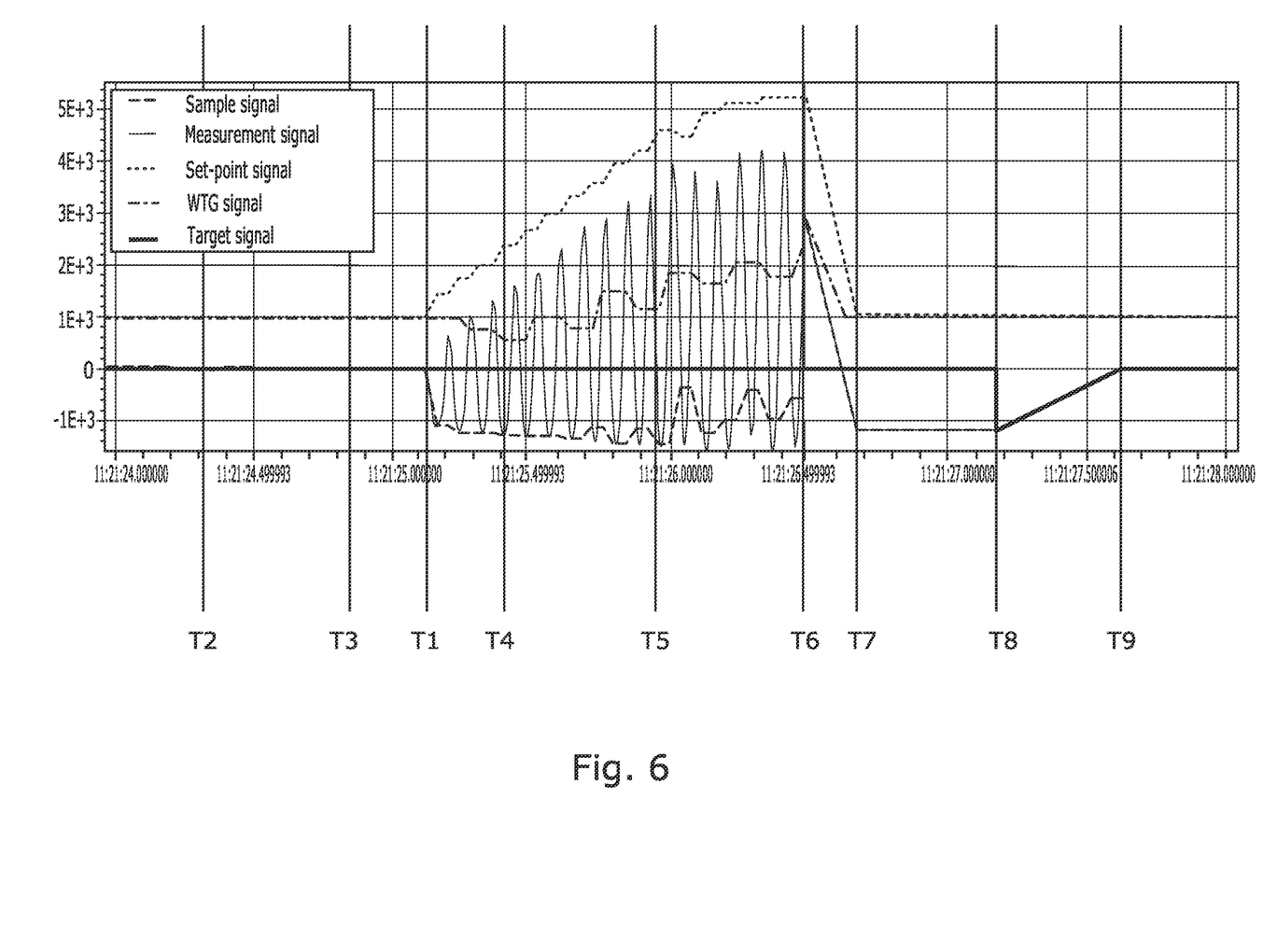
FIG. 6 is a representation demonstrating an example fault scenario, and the response of the wind power plant according to the method of FIG. 3.
Figure 7:
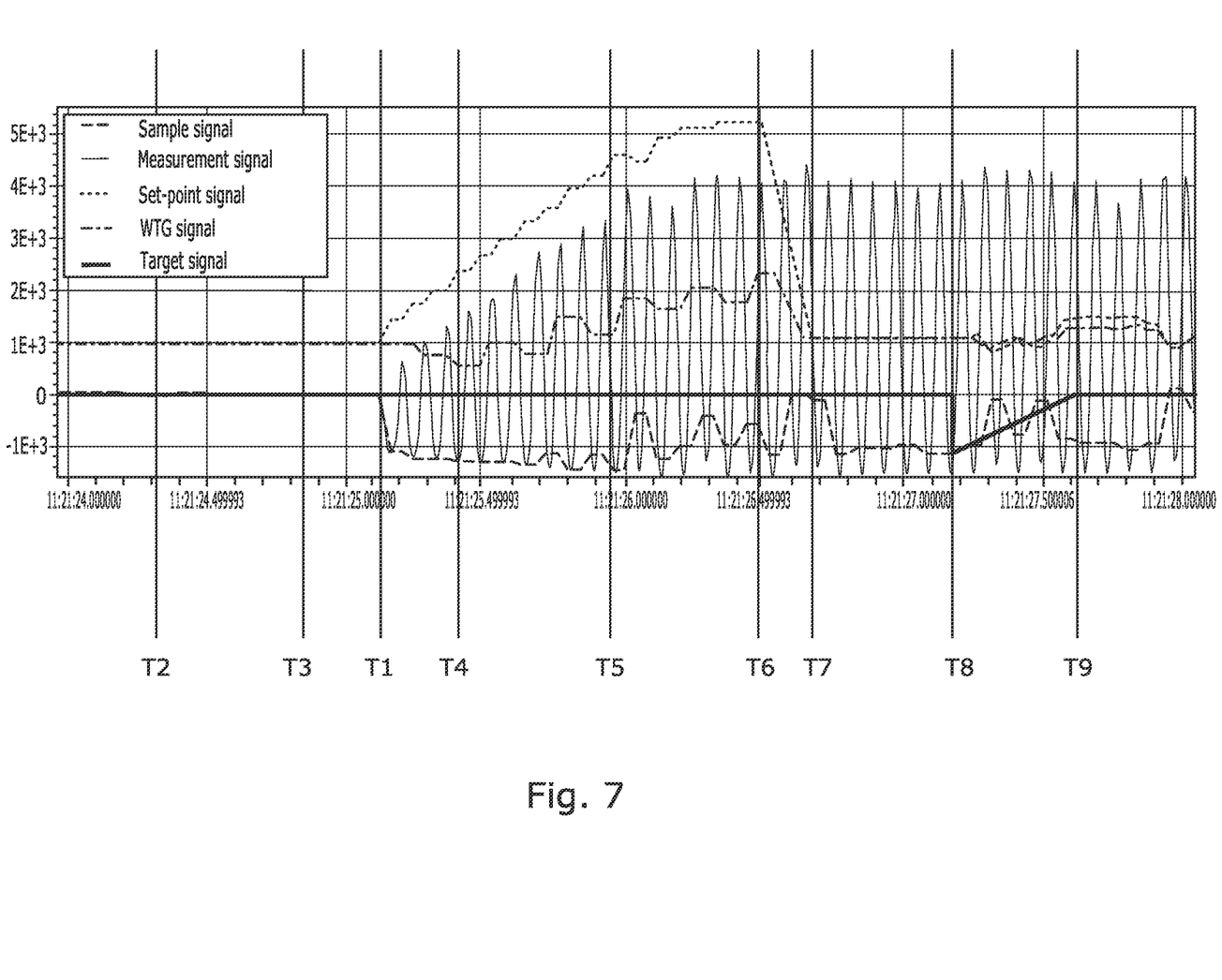
FIG. 7 is a representation demonstrating another example fault scenario, and the response of the wind power plant according to the method of FIG. 3.

By way of example, FIGS. 6 and 7 are provided to illustrate the response of the PPC 22 to a control fault, according to the method 200. FIG. 6 illustrates an example scenario in which the sustained oscillations of the measured power characteristic are the result of aliasing of the measurement signal, while FIG. 7 illustrates another example scenario in which the aliasing of the measurement signal contributes to and exacerbates oscillatory behaviour due to an external fault, such as a grid fault.

For consistency with the previous example, shown in FIG. 2, the measured power characteristic is depicted in each graph as the reactive power level at the PoI 20 and each graph includes a measurement signal representing the measured level of the reactive power, a target signal representing the target level for the reactive power, a sample signal depicting the sampled measurements acquired by the active and reactive power controller 100 at the sample rate, a set-point signal depicting the reactive power set points determined by the active and reactive power controller 100, and a WTG signal depicting the reactive power level of the WTGs 14.

As shown in FIG. 6, initially, the PPC 22 receives the measurement signal, in step 202, and controls the WPP 12 to provide, thus generate or consume, reactive power according to the normal mode of operation. Up to the time, T1, the measurement signal is substantially equal to the target signal and the set-point signal is therefore held substantially constant. During this period, the PPC 22 independently monitors the measurement signal, in step 210, and determines successive non-oscillatory periods, in sub-step 212, and stores information, such as the determined reactive power set-points, for the two most recent non-oscillatory periods in the memory module 32. In particular, as shown in FIG. 6, a first non-oscillatory period is detected between times T2 and T3, and a second non-oscillatory period is detected between times T3 and T4. However, after the time, T1, the measurement signal starts to oscillate, for example due to a fault or disturbance of the WPP 12 and/or the main grid 16. The oscillations of the measurement signal are too high for the sample rate of the active and reactive power controller 100 and so the sampled measurements distort the measurement signal. In particular, aliasing occurs and the sample signal indicates that the measured reactive power level remains below the target signal. As a result, the active and reactive power controller 100 determines and dispatches reactive power set points that increase the reactive power demand, as illustrated by the set-point signal. This has the effect of continuing and/or exacerbating the oscillatory behaviour that may have originally been caused by a grid fault for example. In this example, although the PPC 22 may detect that undersampled oscillations have occurred between the time T1, and the time T4, the PPC 22 may still classify the period T3 to T4 as non-oscillatory as there is less than a threshold number of undersampled oscillations. However, between the times, T4 and T5, the PPC 22 determines a consecutive pair of oscillatory periods (T4 to T5 and T5 to T6), in sub-step 212, and the PPC 22 therefore detects the control fault, in sub-step 216, at the time T6. Consequently, the PPC 22 enters the fault mode of operation, in step 218, and generates an alert for notifying an operator of the WPP 12 of the control fault, in sub-step 220. During the fault mode of operation, the PPC 22 determines the reactive power set-points based on the reactive power set-points determined prior to the fault, and in particular, during the earliest non-oscillatory period stored in the memory module 32 (i.e. between the times T2 and T3). Accordingly, the PPC 22 recalls the set-points, in sub-step 224, and determines a reference reactive power level as an average of those set-points, in sub-step 226. On this basis, the PPC 22 ramps the reactive power set points down to that reference level, in accordance with sub-step 228 to 230, between the time T6 and T7. In this example, the original fault causing the oscillatory behaviour may have been resolved shortly after T1, however the continued oscillations may have been the result of the aliasing for the measured reactive power level. Hence, as the PPC 22 ramps down the reactive power set points, the oscillations of the measurement signal may be substantially eliminated and the measured power level may ramp down accordingly. After the time T7, the PPC 22 freezes the reactive power set-points at the reference reactive power level for the remainder of the fault mode of operation, i.e. until the time T8. Hence, the measurement signal remains constant. At the time T8, the PPC 22 detects that the end conditions have been satisfied, in step 234, as the prescribed period of time for the fault mode of operation may have elapsed, for example. Accordingly, the PPC 22 implements the bumpless transfer operation, in step 236, to adjust the target level, between the time T8 and the time T9, and returns to controlling the WPP 12 to generate or consume reactive power according to the normal mode of operation, in step 204.

In this manner the oscillations of the measured power characteristic are counteracted, and the WPP 12 returns to the normal mode of operation to satisfy the power demands of the grid operator 26.

In FIG. 7, the PPC proceeds to control the WPP 12 to provide power in substantially the same manner. However, in this example, although the set points are determined and dispatched according to the fault mode of operation between times T6 and T8, the oscillations of the measurement signal persist due to the fault source being external. In this scenario, the invention therefore serves to notify the operator of the fault having an external source, whilst the fault mode of operation mitigates further amplification, sustainment or exacerbation of the oscillations due to aliasing. Of course, the fault mode may be applied until one or more end conditions are satisfied, where the end condition in the illustrated example is that a threshold period of time has elapsed. In other examples, the end condition may include an override signal being received from an operator and/or detecting a non-oscillatory period of the measured power characteristic, for example. As shown in FIG. 7, the bumpless transfer operation is then implemented to adjust the target level at the time T8 and the PPC 22 returns to the normal mode of operation. However, in this scenario, it can be seen that the determined set points start to rise again due to aliasing of the oscillatory measurement signal and it shall therefore be apricated that the process 200 may be repeated, substantially as described above, until the fault is resolved.

Figure 8:
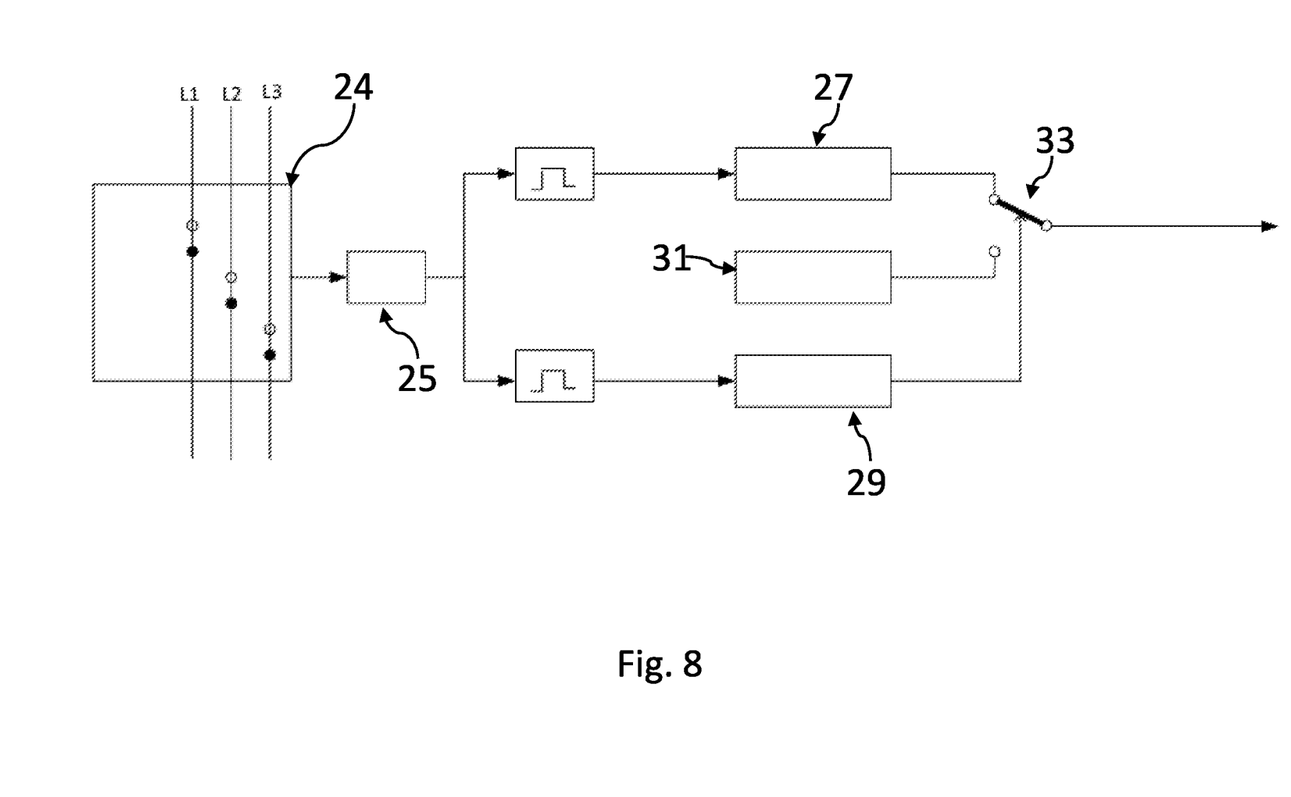
FIG. 8 is a schematic architecture of a method and power plant controller in accordance with an embodiment of the invention.

FIG. 8 shows a schematic view of an embodiment of the invention. The power characters are measured at the point of measure 24 in the cable (shown as a three-phase cable) connecting the WPP 12 with the main grid 16 by use of a power meter. The measurement signal is forwarded to a normal controller 27 operating according to normal mode of operation and to an oscillation detector 29 which monitors the measurement signals to detect undersampled oscillations of the measured power characteristic. The normal controller 27 determines power set points based on sampled measurements and a target power level. There is also shown a fault mode controller 31 which determines power set points according to a fault mode of operation. The oscillation detector control a (figurative) switch 33 such that if no oscillations are detected then the switch is positioned as shown where the power set points generated from the normal controller 27 are dispatched to one or more renewable energy generators 14; whereas if oscillations are detected then the power set points determined by the fault mode controller 31 are dispatched to the one or more renewable energy generators 14.

Many modifications may be made to the above examples without departing from the scope of the present invention as defined in the accompanying claims.

For example, it shall be appreciated that, in other examples, the corrective power control described in sub-step 222 of the method 200, may be triggered automatically upon applying the fault mode of operation, or following a command from an operator of the WPP 12, for example.

Furthermore, in some embodiments, alternative renewable energy generators or a hybrid power plant may be operated according to the methods described herein.

The invention claimed is:

1. A method of operating a renewable energy power plant comprising one or more renewable energy generators, the method comprising:
   receiving a measurement signal indicative of a measured power characteristic of the renewable energy power plant at a point of connection to a power network;
   controlling the renewable energy power plant according to a normal mode of operation to provide power by determining and dispatching power set points, the power set points being determined by:
      acquiring samples of the measurement signal at a sample rate; and
      determining the power set points based on the sampled measurements and a target level for the measured power characteristic; and
   monitoring the measurement signal to detect an undersampled oscillation of the measured power characteristic in the sampled measurements, and thereby detecting a control fault; and
   when the control fault is detected, controlling the renewable energy power plant according to a fault mode of operation.

2. The method according to claim 1, wherein the fault mode of operation comprises generating an alert for notifying an operator of the control fault.

3. The method according to claim 1, wherein the fault mode of operation comprises: controlling the renewable energy power plant to provide power by determining and dispatching power set points based on a reference power level.

4. The method according to claim 3, wherein the fault mode of operation further comprises: determining the reference power level based on one or more power set points determined prior to the fault.

5. The method according to claim 3, wherein determining and dispatching power set points during the fault mode comprises:
   calculating a rate of change for transitioning between a current power set point and the reference power level; and
   determining and dispatching the power set points based on the calculated rate of change.

6. The method according to claim 5, wherein determining and dispatching power set points during the fault mode further comprises:
   determining and dispatching the power set points at the reference power level, once reached, for a remainder of the fault mode of operation.

7. The method according to claim 1, wherein the fault mode is applied until one or more end conditions are satisfied.

8. The method according to claim 7, wherein the one or more end conditions include one or more selected from:
   a threshold period of time having elapsed since applying the fault mode;
   an override signal being received from an operator; and
   detecting a non-oscillatory period of the measured power characteristic.

9. The method according to claim 7, wherein, following the fault mode of operation, the method further comprises:
   implementing a bumpless transfer operation; and
   controlling the renewable energy power plant according to the normal mode of operation; wherein the bumpless transfer operation comprises determining the target level for the power characteristic following the fault mode by:
      setting the target level for the power characteristic to a present sample measurement level; and
      calculating a rate of change to transition between the target level and a post-fault target level suitable for normal operation of the renewable energy power plant.

10. The method according to claim 1, wherein the step of monitoring the measurement signal to detect an undersampled oscillation in the sampled measurements comprises:
   performing spectral analysis on successive periods of the measurement signal to detect an oscillatory period of the measured power characteristic having one or more undersampled oscillations.

11. The method according to claim 10, wherein:
   one or more power set points determined during a non-oscillatory period are stored in a memory;
   a reference power level is determined based on the one or more set points stored in the memory; and
   the fault mode of operation comprises: controlling the renewable energy power plant to provide power by determining and dispatching the one or more power set points based on the reference power level.

12. The method according to claim 11, wherein the memory stores one or more power set points determined during the most recent two non-oscillatory periods.

13. The method according to claim 10, wherein detecting the control fault comprises:
   detecting at least two successive oscillatory periods having undersampled oscillations, each oscillation having a greater frequency than half the sampling rate, using the spectral analysis.

14. The method according to claim 10, wherein the spectral analysis is performed using a Fast Fourier Transform.

15. A power plant controller for controlling operation of a renewable energy power plant comprising one or more renewable energy generators and connected to a power network, the power plant controller being configured to execute machine readable instructions to:
   receive a measurement signal indicative of a measured power characteristic of the renewable energy power plant at a point of connection to a power network;
   control the renewable energy power plant according to a normal mode of operation to provide power by determining and dispatching power set points, the power set points being determined by:
      acquiring samples of a measurement level at a sample rate; and
      determining the power set points based on the samples and a target level for the measured power characteristic; and
   monitor the measurement signal to detect an undersampled oscillation of the measured power characteristic in the sampled measurements, and thereby detect a control fault; and
   when the control fault is detected, control the renewable energy power plant according to a fault mode of operation.

* * * * *